(12) United States Patent
De Samber et al.

(10) Patent No.: US 8,622,578 B2
(45) Date of Patent: Jan. 7, 2014

(54) FLEXIBLE LED ARRAY

(75) Inventors: Marc Andre De Samber, Eindhoven (NL); Marten Sikkens, Eindhoven (NL); Hendrik Eggink, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 697 days.

(21) Appl. No.: 11/909,825

(22) PCT Filed: Mar. 22, 2006

(86) PCT No.: PCT/IB2006/050877
§ 371 (c)(1),
(2), (4) Date: Sep. 27, 2007

(87) PCT Pub. No.: WO2006/103596
PCT Pub. Date: Oct. 5, 2006

(65) Prior Publication Data
US 2008/0225523 A1     Sep. 18, 2008

(30) Foreign Application Priority Data
Mar. 30, 2005  (EP) .................................. 05102491

(51) Int. Cl.
*F21S 4/00* (2006.01)
(52) U.S. Cl.
USPC ............ 362/249.04; 362/249.02; 362/249.03; 362/373
(58) Field of Classification Search
USPC ................. 362/373, 249.02–249.04; 313/500
See application file for complete search history.

(56) References Cited

U.S. PATENT DOCUMENTS

| | | | |
|---|---|---|---|
| 4,774,434 A * | 9/1988 | Bennion | 313/500 |
| 5,119,174 A | 6/1992 | Chen | |
| 6,857,767 B2 * | 2/2005 | Matsui et al. | 362/373 |
| 2003/0072153 A1 | 4/2003 | Matsui | |
| 2004/0184272 A1 * | 9/2004 | Wright et al. | 362/373 |

FOREIGN PATENT DOCUMENTS

JP          06310763          11/1994

* cited by examiner

*Primary Examiner* — Sean Gramling
(74) *Attorney, Agent, or Firm* — John F. Salazar; Mark L. Beloborodov

(57) ABSTRACT

A light emitting device, comprising a flexible substrate (2) with a single, structured conductive layer (5), and a plurality of LEDs (3) arranged on said substrate (2), said structured conductive layer (5) forming electrodes for driving said LEDs (3). The structured conductive layer comprises a plurality of heat dissipating pads (8), each having an area significantly larger than the area of each LED (3), and each LED (3a) is thermally connected to at least one of said pads (8a), and electrically connected in series between two pads (8a, 8b). Through this design, each LED is thermally connected to a relatively large heat dissipating area, and the thermal energy built up in the LED will be distributed over this area, and then dissipated upwards and downwards from this area. As the addressing can be handled by a single conducting layer, the flexibility of the substrate is improved compared to multilayer substrates. By connecting each LED in series between two pads, a very large portion of the conducting layer can be used for the pads, and very little area needs to be occupied by conducting tracks, which otherwise may be a problem with single layer designs.

3 Claims, 4 Drawing Sheets

FLEXIBLE LED ARRAY

The present invention relates to a flexible LED array, and more specifically to a light emitting device comprising a plurality of LEDs arranged on a flexible substrate with a single, structured conductive layer forming electrodes for driving the LEDs.

A flexible light-emitting unit is disclosed in US 2003/0067775. The unit comprises a multi-layer substrate, having a plurality of red, green and blue LEDs, with each color connected in series.

A problem associated with multiple-LED devices in general, and flexible LED arrays in particular, is heat dissipation. If not handled satisfactorily, the temperature of the LEDs will rise, leading to deteriorating light efficiency. In the unit described in US 2003/0067775, heat dissipation is handled by a fin structure on a radiating plate, bonded to the back of the substrate. Such a solution can only dissipate heat in one direction from the LEDs, and will not achieve the required heat dissipation. Further, such a solution makes the unit bulky, and to a large extent removes the desired flexibility.

It is an object of the present invention to overcome these problems, and to provide a flexible lighting device with improved heat dissipation.

It is a further object to provide a flexible lighting device, which is simple in design and cost effective to manufacture.

These and other objects are achieved by a light emitting device of the kind mentioned in the introduction, wherein the structured conductive layer comprises a plurality of heat dissipating pads, each having an area significantly larger than the area of each LED, and wherein each LED is thermally connected to at least one of the pads, and electrically connected in series between two pads.

Through this design, each LED is thermally connected to a relatively large heat dissipating area, and the thermal energy built up in the LED will be distributed over this area, and then dissipated upwards and downwards from this area.

As the addressing can be handled by a single conducting layer, the flexibility of the substrate is improved compared to multilayer substrates. By connecting each LED in series between two pads, a very large portion of the conducting layer can be used for the pads, and very little area needs to be occupied by conducting tracks, which otherwise may be a problem with single layer designs.

Each LED can be attached, e.g. die attached, on top of one of the pads, with one of its terminals electrically connected to this pad, and its other terminal electrically connected to a conducting track leading to another pad. This offers a simple implementation of the serial connection of a LED between pads. The die attachment provides for adequate thermal connection.

The LEDs can include LEDs adapted to emit a plurality of different colors that are serially connected in sets comprising only LEDs having the same color. The serial connection of sets of LEDs makes it possible to address individual lines of the light-emitting device. Such addressing may be used to compensate for temperature gradients present across the device. For example, if temperature gradients are expected in the vertical direction, the serially connected sets of LEDs can be oriented horizontally, and the applied currents may vary depending on the vertical position of the set, thereby compensating the varying light intensity resulting from varying temperature.

The LEDs can be arranged in groups, each group comprising LEDs adapted to emit light of different colors (R, G, B), and preferably selected to emit white light in combination. Such grouping may be advantageous in illumination applications, where normally a white light is preferred. However, other groupings may also be preferred.

According to one embodiment, each pad is thermally connected only to one LED, and preferably positioned asymmetrically on the pad, so that several LEDs positioned on different pads are arranged closely together in groups. Preferably, the pads have an essentially rectangular shape, and are arranged in a straight grid pattern, so that the LEDs connected to four pads in a two-by-two array are positioned in interiorly facing corners of each pad. This is a simple layout that effectively uses a large portion of the conductive layer to form pads, while still allowing for grouping of LEDs in groups of four. Using rectangular pads also has the advantage that the conductive layer will be easy to adjust to the flexible substrate, due to the straight lines between the pads (where the conductive layer has been removed, e.g. etched away).

According to a second embodiment, each pad is thermally connected to a plurality of LEDs, so that several LEDs positioned on different pads are arranged closely together in groups. The LEDs can be positioned symmetrically around the periphery of the pad. If again the pads are rectangular in shape, and four LEDs are positioned in its corners, again a simple layout is provided making effective use of the conductive layer area and providing grouping of LEDs in groups of four.

This and other aspects of the present invention will now be described in more detail, with reference to the appended drawings showing a currently preferred embodiment of the invention.

Figure 1:
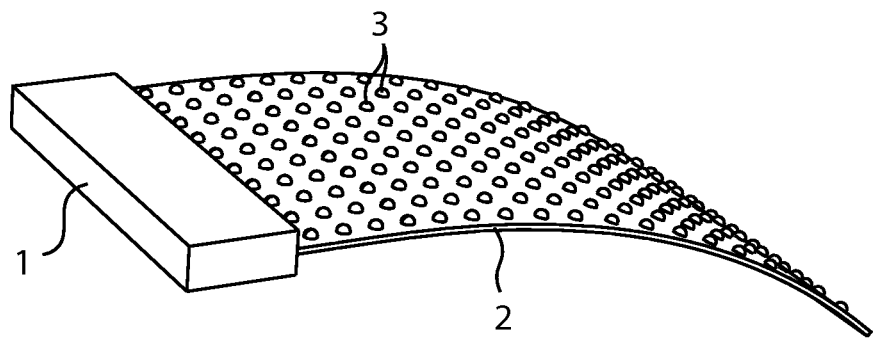
FIG. 1 shows a schematic, perspective view of a light-emitting device according to an embodiment of the invention.

FIG. 1 shows a light-emitting device comprising a control unit 1, a flexible substrate 2, and a plurality of LEDs 3 arranged on the substrate. The control unit 1 contains any drive circuitry, interfaces, connectors, etc, required to connect the device to a power source, and to drive the LEDs to emit light. As the control unit keeps all the control circuitry close together, the electronics can be well protected. However, the control unit forming part of the flexible device will be rigid.

As an alternative, the control circuitry may be distributed over the substrate, e.g. along its sides. This can allow a fully flexible device, but will not allow for optimal physical protection of components.

The power supply of the device may be of conventional kind, with a connector or even batteries contained in the control unit 1. However, it may be advantageous to provide for non-connected power supply. For example, capacitive or inductive powering could be used.

As shown more clearly in FIG. 2, the substrate has a single conductive layer 5, typically copper, arranged on a flexible layer 6, such as polyimide, polyester etc. The substrate is preferably also provided with an adhesive layer 7, for facilitating attachment of the device on a surface.

Figure 2A:
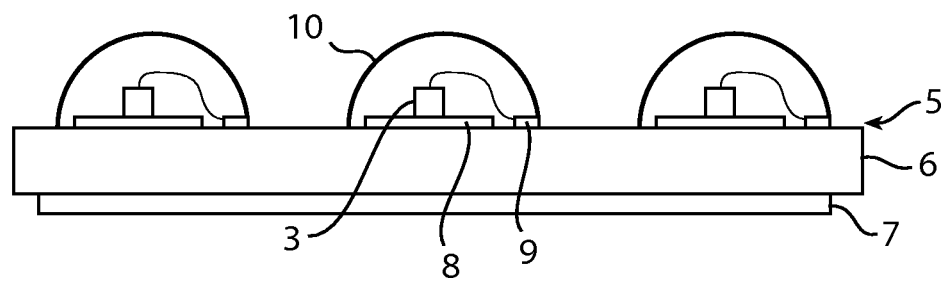
FIGS. 2a and 2b show a sectional side view of a portion of the device in FIG. 1.
Figure 2B:
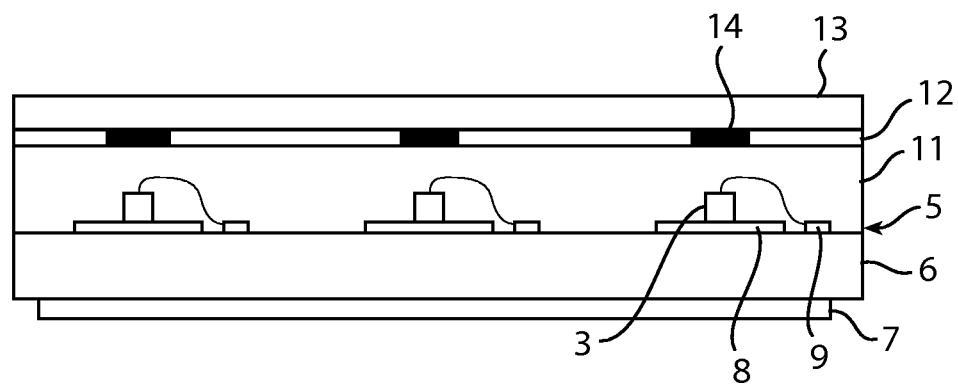

In FIGS. 2a-2b, only two LEDs 3 are shown for sake of simplicity. Typically, the device in FIG. 1 can comprise hundreds or thousands of LEDs. The LEDs 3 are die attached to heat dissipating pads 8 formed in the conductive layer 5, and wire bonded to tracks 9 also formed in the conductive layer. The pads 8 and tracks 9 will be described in more detail with reference to FIG. 3 below.

The wire bonded LEDs can be protected mechanically by applying a silicone droplet 10, as shown in FIG. 2a. Preferably, however, and as shown in FIG. 2b, the ensemble of assembled LEDs is coated by a silicone layer 11, providing the required mechanical protection. Given suitable thickness, such a protective layer can also contribute to the heat transfer from the LEDs 3, mainly in a direction sideways from the LEDs.

The embodiment in FIG. 2b further comprises a semi-blocking sheet 12, and a diffusing sheet 13. The semi-blocking sheet 12 comprises non-transparent areas 14, positioned immediately above each LED, thereby preventing direct perpendicular light extraction, allowing side emission only. The diffusion sheet 12 then ensures a very diffuse light extraction, suitable for illumination purposes.

Figure 3:
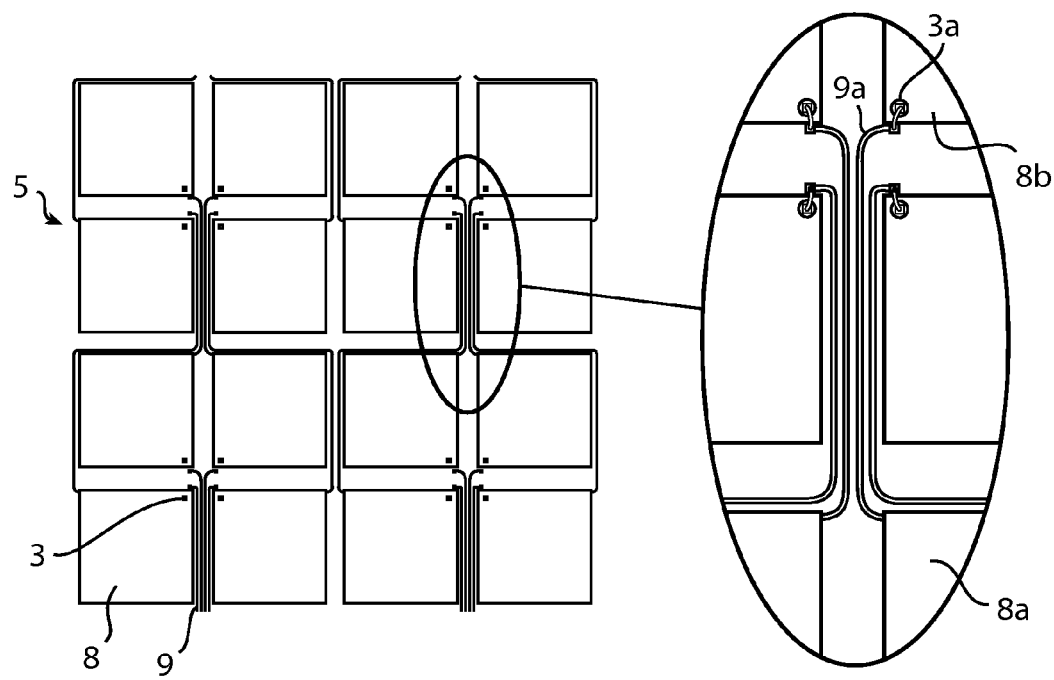
FIG. 3 shows in more detail LEDs attached to a conductive layer layout according to a first embodiment of the device in FIG. 1.

FIG. 3 shows in more detail how the conducting layer 5 is structured into pads 8 and tracks 9. As seen in the left part of FIG. 3, the pads 8 constitute the larger part of the area of the layer 5, and each pad 8 has a significantly larger area than the LED 3 attached on its surface. The relatively large area of each pad ensures a satisfactory heat dissipation of the thermal energy generated by the LED. As an example, an area of approximately 25 mm$^2$ can be suitable for dissipation of heat from one LED, in the case of die attached "naked" (i.e. not packaged) LED dies, with LED power of around 100 mW. In the example in FIG. 3, the pads 8 are rectangular in shape, and arranged in a straight grid pattern. The tracks 9, which only constitute a small fraction of the area of the substrate, are arranged to enable serial connection of the LEDs 3. More precisely, and as shown in greater detail in the right part of FIG. 3, a track 9a leading from a pad 8a will be wore bonded to a LED 3a that is attached on the surface of a different pad 8b.

Figure 4:
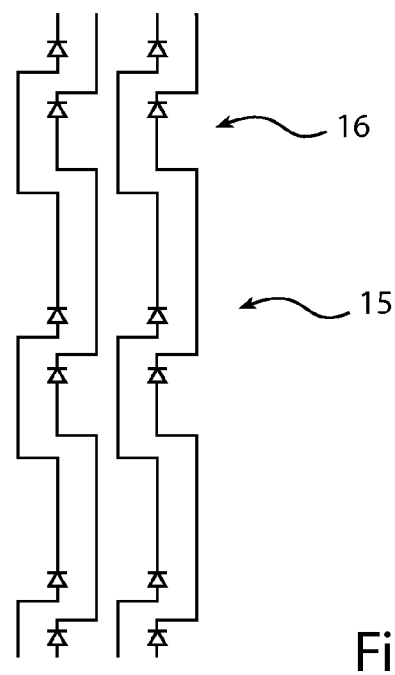
FIG. 4 shows a schematic circuit diagram of the layout in FIG. 3.

In the illustrated example, the LEDs 3 is grouped together in groups of four. This can be achieved by positioning each LED 3 in a corner of the rectangular pads 8, in such a way that four neighboring corners of different pads 8 all carry a LED. Such grouping of LEDs can advantageously be employed for combining light emitted from different colored LEDs. For example, the group of four LEDs may comprise a R (red), a B (blue) and two G (green) LEDs, thereby in combination emitting a white light. Other combinations are of course also possible, including various RGBX alternatives, such as red, green, blue and amber, or red, green, blue and yellow. It is preferable to ensure that LEDs with a certain position in the group are serially connected to other LEDs in the same position. This was described above with reference to FIG. 3, and is shown even more clearly in FIG. 4, illustrating a circuit diagram of three groups of LEDs, corresponding to the layout in FIG. 3. It is clear that the LEDs in one group 15 are serially connected to the respective LEDs in the next group 16, and it is clear that equally positioned LEDs (e.g. upper right hand corner) are serially connected in sets.

Figure 5:
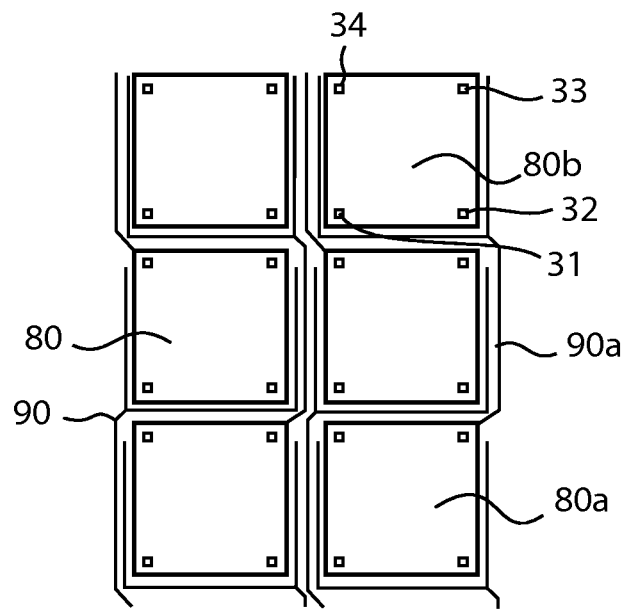
FIG. 5 shows in more detail LEDs attached to a conductive layer layout according to a second embodiment of the device in FIG. 1.
Figure 6:
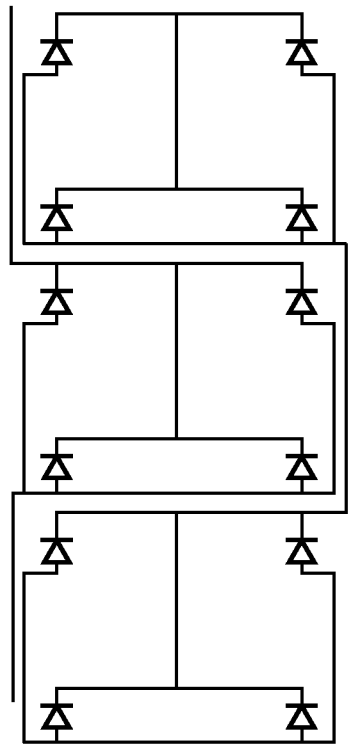
FIG. 6 shows a schematic circuit diagram of the layout in FIG. 5.

It should be noted that in the embodiment shown in FIG. 3, only one LED 3 is attached to each pad 8. Alternatively, as shown in FIG. 5, several LEDs 31, 32, 33, 34 can be attached to one pad 80, as long as the wire bonding and conductive tracks 90 are adapted in a suitable way. In the illustrated case, the track 90a coming from one pad 80a will be wire bonded to a plurality of LEDs 31-34 attached on the surface of another pad 80b. In order to achieve a similar grouping as described above, four LEDs 31-34 can be positioned in the corners of each rectangular pad 80 in a straight grid pattern of such pads. A circuit diagram corresponding to the layout in FIG. 5 is shown in FIG. 6. Alternatively (not shown), the pads in FIG. 5 are divided in two, so that each pad is provided with two LEDs, situated in two corners on one side of the pad. Clearly, other designs may be contemplated by the skilled man. The person skilled in the art realizes that the present invention by no means is limited to the preferred embodiments described above. On the contrary, many modifications and variations are possible within the scope of the appended claims. For example, the shape and arrangement of the pads 8, 80 can vary, as long as an adequate heat dissipation is achieved, and the rectangular shape disclosed herein can be replaced by e.g. a hexagon shape.

In yet another embodiment, each LED is electrically connected directly between two pads, i.e. no tracks are required as in the examples in FIGS. 3 and 5. Such an embodiment is schematically illustrated in FIG. 7, intended only to illustrate the principle.

Figure 7:
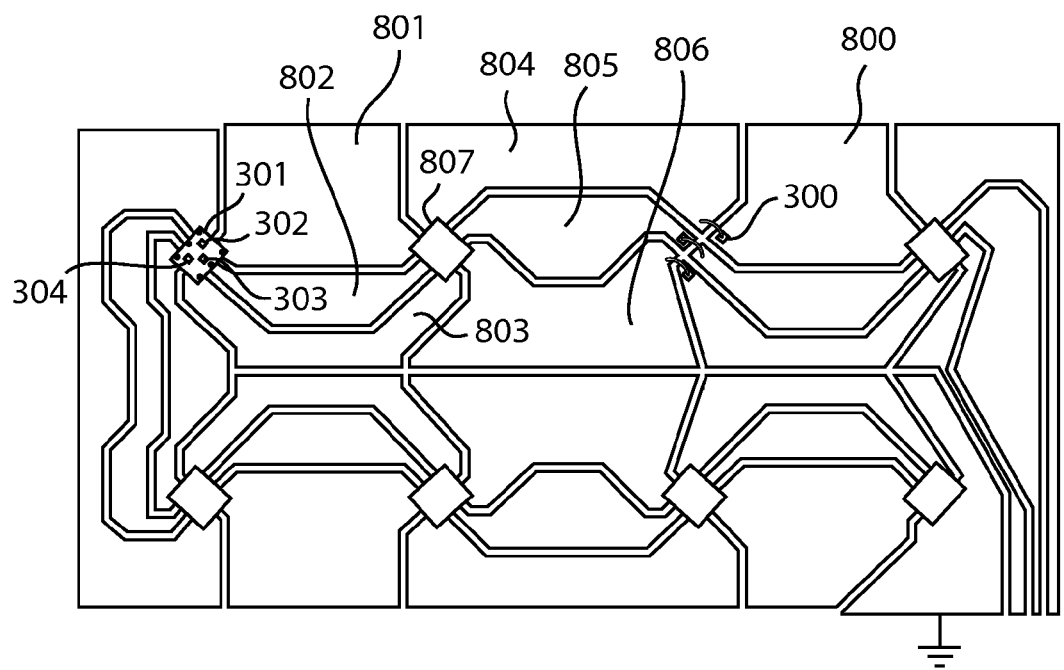
FIG. 7 shows in more detail LEDs attached to a conductive layer layout according to a third embodiment of the device in FIG. 1.

As can be seen in FIG. 7, the pads 800 have different shapes, together covering the substrate in such a way that end portions of six pads 801, 802, 803, 804, 805, 806 meet in one area 807. In this area, three LEDs 300 can be connected electrically in series between respective pairs of pads. As an example, and resembling the embodiments in FIGS. 3 and 5, each LED is die attached on one pad in a pair, and wire bonded to the other pad in the pair. Alternatively, a LED unit 301 comprising three LEDs 302, 303, 304 is attached (thermally and electrically) to all six pads in a suitable way. In this latter case, it is possible that the heat dissipative function is shared by all six pads, depending on how the unit 301 is thermally connected to the pads.

It should be noted that the design given in FIG. 7 is only an example. The exact form of the different pads, as well as the number of LEDs in each junction area 807 can be determined by the skilled person. However, care should be taken not to reduce the flexibility of the device. For this reason, it may be advantageous to ensure that the lines between the pads at least regularly form essentially straight lines, to facilitate bending of the conductive layer.

Summarizing, the invention relates to a light emitting device, comprising a flexible substrate 2 with a single, structured conductive layer 5, and a plurality of LEDs 3 arranged on said substrate 2, said structured conductive layer 5 forming electrodes for driving said LEDs 3. The structured conductive layer comprises a plurality of heat dissipating pads 8, each having an area significantly larger than the area of each LED 3, and each LED 3a is thermally connected to at least one of said pads 8a and electrically connected in series between two pads 8a, 8b.

Through this design, each LED is thermally connected to a relatively large heat dissipating area, and the thermal energy built up in the LED will be distributed over this area, and then dissipated upwards and downwards from this area.

As the addressing can be handled by a single conducting layer, the flexibility of the substrate is improved compared to multilayer substrates. By connecting each LED in series between two pads, a very large portion of the conducting layer can be used for the pads, and very little area needs to be occupied by conducting tracks, which otherwise may be a problem with single layer designs.

The invention claimed is:

1. A light emitting device, comprising:
a flexible substrate having an upper surface;
a plurality of electrically conductive heat dissipating pads arranged on said upper surface of said flexible substrate;
a plurality of LEDs arranged on the heat dissipating pads, wherein each pad is arranged between the flexible substrate and at least one LED
a plurality of tracks connecting directly to the LEDs such that the LEDs are electrically driven through the tracks and the pads,
wherein each pad is thermally connected to two or more LEDs asymmetrically positioned thereon, and
wherein several LEDs positioned on different pads are arranged closely together in groups such that LEDs in a first group are serially connected to respectively positioned LEDs in a second group and further similarly positioned LEDs are serially connected in sets;
wherein said plurality of pads include
at least a first pair of pads having at least one LED of said two or more LEDs on each said pad positioned at a first position on said heat dissipating pad, and
at least a second pair of pads having at least one LEDs of said two or more LEDs on each said pad positioned at a second position on said heat dissipating pad different than said first position.

2. A flexible LED array lighting device, comprising:
a flexible substrate having an upper surface;
an electrically conductive layer formed on said upper surface;
said electrically conductive layer formed into a plurality of heat dissipating pads;
each of said heat dissipating pads having at least one associated LED positioned thereon;
said at least one associated LED having a first electrode electrically connected to a conductive track formed on said upper surface and a second electrode electrically connected to said associated heat dissipating pad;
wherein said upper surface of said flexible substrate has a plurality of tracks;
each of said plurality of tracks being in electrical and serial connectivity with a plurality of LEDs forming said LED array;
said at least one associated LED positioned asymmetrically on said heat dissipating pad;
each of said plurality of LEDs forming said LED array are serially connected to alternate LEDs of said LED array in a similar position on an alternate heat dissipating pad;
at least a first pair of said plurality of heat dissipating pads having said at least one LED on said pad positioned in a first position on said heat dissipating pad and at least a second pair of heat dissipating pads having said at least one LED on said pad positioned in a second position different than said first position.

3. A lighting device, comprising:
a flexible substrate having an upper surface;
an electrically conductive layer formed into a plurality of heat dissipating pads on said upper surface;
each of said heat dissipating pads having at least one associated LED positioned thereon;
said at least one associated LED having a first electrode electrically connected said upper surface and a second electrode electrically connected to said associated heat dissipating pad;
said associated LED in electrical and serial connectivity with a plurality of LEDs forming an LED array;
said at least one associated LED positioned asymmetrically on said heat dissipating pad;
each of said plurality of LEDs forming said LED array arc serially connected to alternate LEDs of said LED array in a similar position on an alternate heat dissipating pad;
at least a first pair of said plurality of heat dissipating pads each having said at least one associated LED on said pad positioned in a first position on said heat dissipating pad and at least a second pair of heat dissipating pads each having said at least one associated LED on said pad positioned in a second position different than said first position.

* * * * *